(12) United States Patent
DeCesaris et al.

(10) Patent No.: US 9,261,098 B2
(45) Date of Patent: Feb. 16, 2016

(54) FAN SPEED AND MEMORY REGULATOR CONTROL BASED ON MEMORY MARGIN

(71) Applicant: Lenovo Enterprise Solutions (Singapore) PTE. LTD., Singapore (SG)

(72) Inventors: Michael DeCesaris, Carrboro, NC (US); James J. Parsonese, Cary, NC (US); Luke D. Remis, Raleigh, NC (US); Philip L. Weinstein, Apex, NC (US)

(73) Assignee: LENOVO ENTERPRISE SOLUTIONS (SINGAPORE) PTE. LTD., Serangoon Garden (SG)

( * ) Notice: Subject to any disclaimer, the term of this patent is extended or adjusted under 35 U.S.C. 154(b) by 452 days.

(21) Appl. No.: 13/965,486

(22) Filed: Aug. 13, 2013

(65) Prior Publication Data

US 2015/0050120 A1     Feb. 19, 2015

(51) Int. Cl.
| | | |
|---|---|---|
| *F01D 1/00* | (2006.01) |
| *G06F 1/20* | (2006.01) |
| *F04D 19/00* | (2006.01) |
| *H05K 7/20* | (2006.01) |
| *F04D 27/00* | (2006.01) |

(52) U.S. Cl.
CPC ............ *F04D 19/002* (2013.01); *F04D 27/004* (2013.01); *G06F 1/20* (2013.01); *G06F 1/203* (2013.01); *G06F 1/206* (2013.01); *H05K 7/20209* (2013.01); *H05K 7/20836* (2013.01); *Y02B 60/1275* (2013.01)

(58) Field of Classification Search
CPC . F04D 19/002; F04D 27/004; H05K 7/20209; H05K 7/20836; G06F 1/206; G06F 1/203; G06F 1/20; Y02B 60/1275

USPC .................. 415/1, 30; 700/299, 300; 361/695
See application file for complete search history.

(56) References Cited

U.S. PATENT DOCUMENTS

| | | | | |
|---|---|---|---|---|
| 5,796,580 | A | * | 8/1998 | Komatsu ............ H05K 7/20727 361/679.47 |
| 7,415,322 | B1 | * | 8/2008 | Pearce ...................... G06F 1/20 361/679.48 |
| 7,506,066 | B2 | | 3/2009 | Nobakht et al. |
| 7,844,750 | B2 | * | 11/2010 | Pearce .................. F04D 27/001 710/15 |
| 8,963,465 | B2 | * | 2/2015 | Chiu ..................... F04D 27/004 165/246 |
| 2006/0005000 | A1 | | 1/2006 | King et al. |

(Continued)

FOREIGN PATENT DOCUMENTS

| | | |
|---|---|---|
| WO | WO2010093356 A1 | 8/2010 |
| WO | WO2011059448 A1 | 5/2011 |

OTHER PUBLICATIONS

ARM Generic Interrupt Controller, Architecture Specification, Version 2.0, ARM IHI 0048B, ARM Limited, 2008, 2011.

(Continued)

*Primary Examiner* — Hoang Nguyen
(74) *Attorney, Agent, or Firm* — Olive Law Group, PLLC

(57) ABSTRACT

Methods and systems for fan speed control based on memory margin are disclosed. According to an aspect, a method includes determining an operating margin of a memory interface. The method also includes determining whether the operating margin of the memory interface meets a predetermined condition. Further, the method includes controlling a speed of a computing system cooling fan based on the operating margin in response to determining the operating margin meets the predetermined condition.

20 Claims, 3 Drawing Sheets

(56) References Cited

U.S. PATENT DOCUMENTS

| | | |
|---|---|---|
| 2010/0205348 A1 | 8/2010 | Moshayedi et al. |
| 2010/0220735 A1 | 9/2010 | Vermunt et al. |
| 2011/0226462 A1* | 9/2011 | Sato ........................ G06F 1/206 165/247 |
| 2012/0042137 A1 | 2/2012 | Takeishi et al. |
| 2012/0198136 A1 | 8/2012 | Moshayedi et al. |
| 2012/0329377 A1 | 12/2012 | Wu |
| 2013/0031303 A1 | 1/2013 | Jeddeloh |
| 2013/0080799 A1 | 3/2013 | Artman et al. |
| 2014/0189177 A1 | 7/2014 | Flint et al. |

OTHER PUBLICATIONS

White Paper; Flash DIMM Technology, Hewlett Packard, Feb. 10, 1998.

DDR Interface Drive Strength, Texas Instruments Embedded Processors Wiki; weblink: http://processors.wiki.ti.com/index.php/DDR_Interface_Drive_Strength; last accessed May 15, 2013, 3 pages.

Lefurgy et al., Active Management of Timing Guardband to Save Energy in POWER7; MICRO 44, Dec. 3-7, 2011, Porto Alegre, Brazil, Copyright 2011 ACM 978-1-4503-1053-6/11/12.

* cited by examiner

FAN SPEED AND MEMORY REGULATOR CONTROL BASED ON MEMORY MARGIN

BACKGROUND

1. Field of the Invention

The present invention relates to computer cooling and regulation systems, and more specifically, to control of fan speed and memory regulators based on memory margin.

2. Description of Related Art

As computing processing power increases, computing systems require more energy to operate. This can lead to heat dissipation problems. Typically, cooling fans are used to cool computing systems, although such cooling fans can consume a lot of power if they are constantly operating or not operating efficiently. For at least these reasons, it is desired to provide improved systems and techniques for controlling computing system cooling fans for improving efficiency.

BRIEF SUMMARY

In accordance with one or more embodiments of the present invention, methods and systems disclosed herein provide for fan speed control based on memory margin. According to an aspect, a method includes determining an operating margin of a memory interface. The method also includes determining whether the operating margin of the memory interface meets a predetermined condition. Further, the method includes controlling a speed of a computing system cooling fan based on the operating margin in response to determining the operating margin meets the predetermined condition.

In accordance with one or more embodiments of the present invention, a method includes determining an operating margin of a memory interface. The method also includes determining whether the operating margin of the memory interface meets a predetermined condition. Further, the method includes controlling a memory regulator output based on the operating margin.

DETAILED DESCRIPTION

As described herein, there are various embodiments and aspects of the present invention. According to embodiments, the present invention is directed to control of fan speed based on memory margin.

Figure 1:
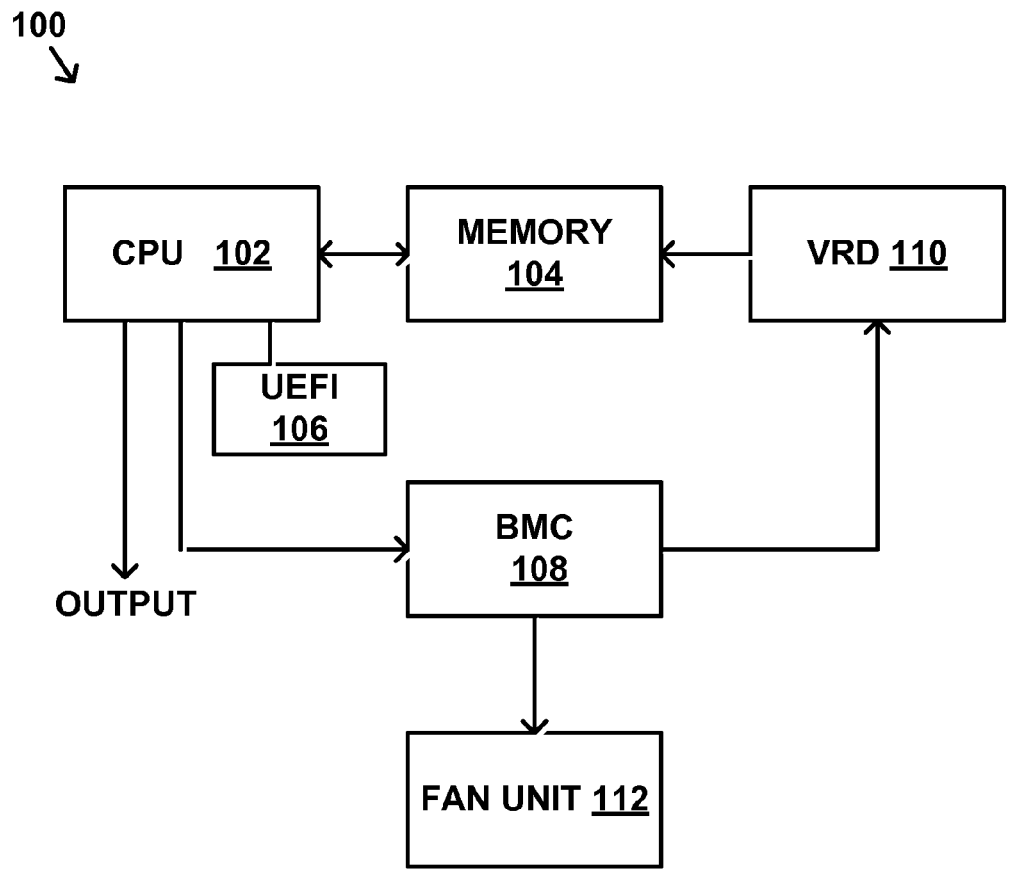
FIG. 1 is a block diagram of a system for controlling fan speed based on memory margin in accordance with embodiments of the present invention.

FIG. 1 illustrates a block diagram of a system 100 for controlling fan speed based on memory margin in accordance with embodiments of the present invention. The system 100 may be part of a server or any other suitable type of computing device. Referring to FIG. 1, the system 100 includes a central processing unit (CPU) 102 and memory 104 communicatively connected for performing functions of the computing device. The CPU 102 may include one or more processors and other hardware. The memory 104 may sequences of instructions for implementation by the CPU 102 and other data. The memory 104 may be, for example, dual in-line memory (DIMM) or any other suitable type of memory. The system 100 may also include one or more buses operable to transmit communications between the various hardware components. The system 100 may include a unified extensible firmware interface (UEFI) platform 106, a baseboard management controller (BMC) 108, a voltage regulator down (VRD) 110, and a fan unit 112.

The UEFI platform 106 is operable to provide an interface between an operating system implemented by the CPU 102 and memory 104 and system hardware. The UEFI platform 106 may be implemented by hardware, software, firmware, or combinations thereof. Further, the UEFI platform 106 may measure or otherwise determine an operating margin of the memory 104. For example, the UEFI platform 106 may write a test pattern over a memory interface into the memory 104. Further in this example, the UEFI platform 106 may read the test pattern from the memory 104 by communication through the CPU 102, and may compare the read pattern to the written pattern to determine error for testing the memory 104 at various conditions.

The BMC 108 is a sub-system of an intelligent platform management interface (IPMI) residing within the system 100 for managing the interface between system management software and platform hardware. The BMC 108 may include a specialized microcontroller embedded on a motherboard. The system 100 may include various sensors that report to the BMC 108 on parameters such as temperature, cooling fan speeds, power status, operating system status, and the like. The BMC 108 is configured to control the fan unit 112. For example, the BMC 108 may control input to the fan unit 112 for varying a speed of the cooling fans.

The fan unit 112 may include one or more cooling fans operable to cool one or more components of the system 100. As an example, a fan may draw cooler air into a computing device from the outside, expel warm air from inside, or move air across a heat sink to cool a particular component. Example components that may be cooled by a fan include, but are not limited to, a CPU, a graphics card, a motherboard chipset, and the like. The speed of a fan may be controlled by input of the BMC 108. As an example, the BMC 108 may determine a temperature of one or more components of the system 100 and control the fan speed to either decrease or increase based on the determined temperature.

Figure 2:
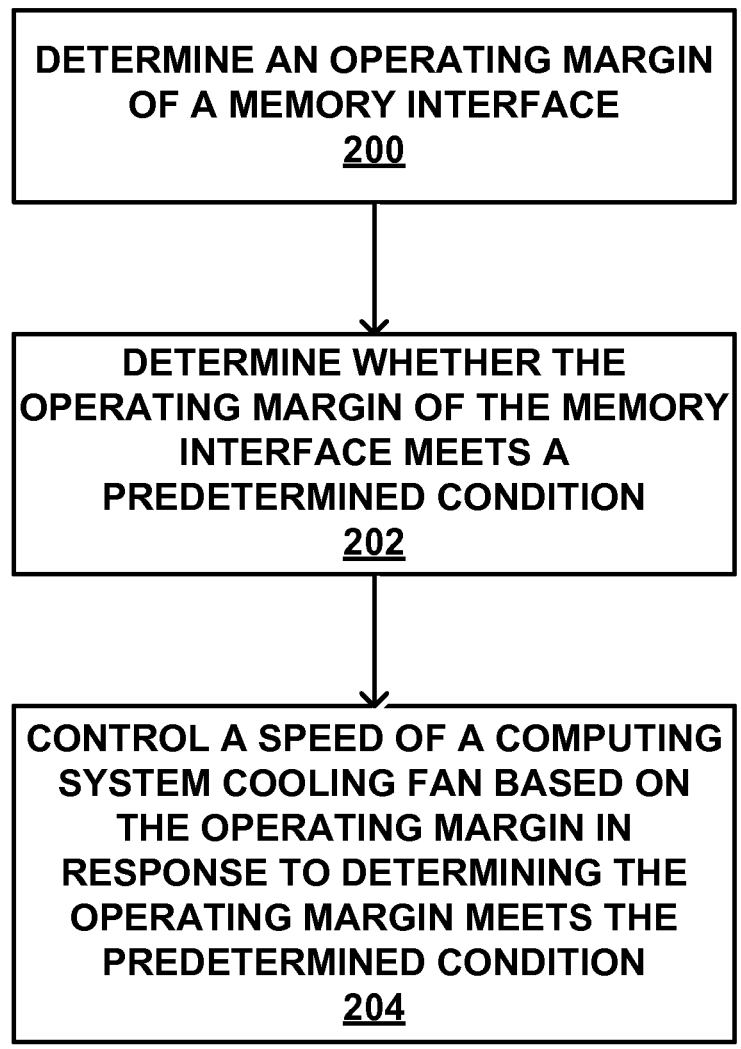
FIG. 2 is a flow chart of an example method for controlling fan speed based on memory margin in accordance with embodiments of the present invention.

In accordance with embodiments of the present invention, FIG. 2 illustrates a flow chart of an example method for controlling fan speed based on memory margin. In this example, reference is made to implementation of the method by components shown in FIG. 1, although it should be understood by those of skill in the art that the method may alternatively be implemented by any other suitable components of a computing device.

Referring to FIG. 2, the method includes determining 200 an operating margin of a memory interface. For example, the UEFI 106 may be configured to determine an operating margin of the memory 104. As an example, BIOS output for memory margin statistics may be decoded and used for allowing the fan unit 112 to operate at a more optimal energy rate. If the system has excess memory margin, it may not be needed to cool the memory as effectively, and as a result the system may consume less power. As another example described in further detail herein, the operating margin may be determined based on the writing and reading of a test pattern to memory.

The method of FIG. 2 includes determining 202 whether the operating margin of the memory interface meets a predetermined condition. Continuing the aforementioned example, the UEFI 106 may communicate the determined operating margin to the BMC 108 via a bus. The BMC 108 may compare the operating margin to a predetermined condition to determine whether control input to the fan unit 112 is to be varied. In an example of analyzing operating margin to determine whether to vary fan speed, a user utilizing an oscilloscope can measure the memory's setup and hold time and feed that back into a table inside UEFI.

The method of FIG. 2 includes controlling 204 a speed of a computing system cooling fan based on the operating margin in response to determining the operating margin meets the predetermined condition. Continuing the aforementioned example, the BMC 108 may communicate a message to the fan unit 112 to control fan speed based on the operating margin. For example, in response to determining there is excess memory margin, the fan unit 112 may be controlled to reduce fan speed from a normal level of operation. Excess margin may include, for example, instances in which the memory interface has plentiful setup and hold time. Suppose, for example, the memory system requires 3 nano-seconds (ns) of setup time, when memory margin is executed via UEFI, or when measured on a scope, it was found that there was 5 ns, there can be considered excess memory margin in the system in such an instance. Otherwise, in response to determining there is not excess memory margin, the fan unit 112 may be left to its normal operation.

Figure 3:
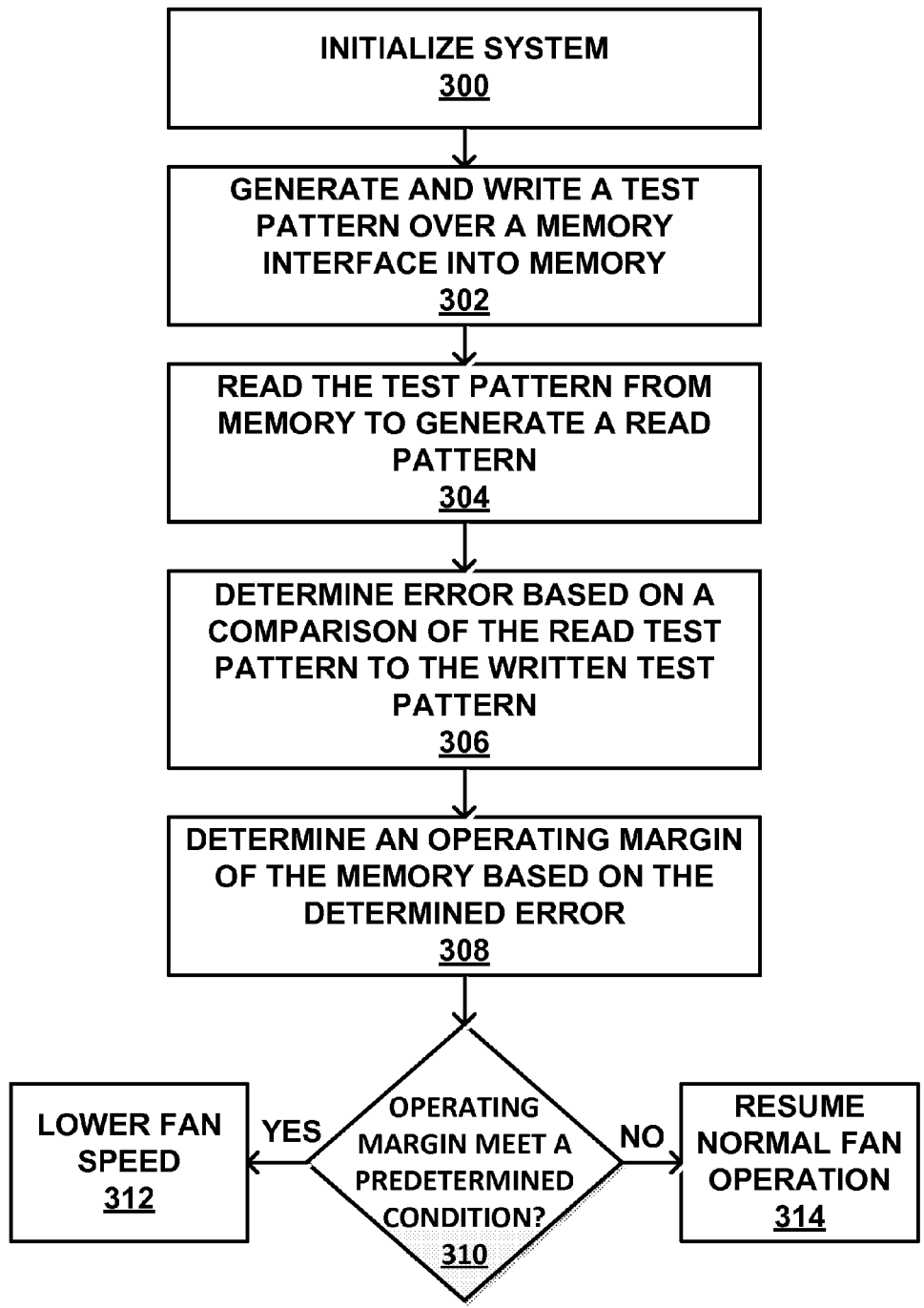
FIG. 3 is a flow chart of an example method for controlling fan speed based on memory margin upon initialization of a system in accordance with embodiments of the present invention.

FIG. 3 illustrates a flow chart of an example method for controlling fan speed based on memory margin upon initialization of a system in accordance with embodiments of the present invention. In this example, reference is made to implementation of the method by components shown in FIG. 1, although it should be understood by those of skill in the art that the method may alternatively be implemented by any other suitable components of a computing device.

Referring to FIG. 3, the method includes initializing 300 a system. For example, the system 100 may power on or boot. During power on or boot, there may be an initial set of operations that the system 100 performs when electrical power is supplied to the CPU 102 and other system components. The power on or boot period may end when the system 100 is ready to perform normal operations. As part of initialization, the method includes generating and writing 302 a test pattern over a memory interface into memory. The test pattern may be implemented in response to determining initialization of the system 100. As an example of implementing a test pattern, the BMC 108 may generate a test pattern for implementation by the VRD 110 on the memory 104. Implementation of the test pattern may involve applying an initial test pattern to the memory 104 and varying the test pattern to determine error. Examples of varying the test pattern may include, but are not limited to, varying one or both of receiver voltage and timing thresholds applied by the VRD 110 to the memory 104. In another example, the test pattern may be varied by varying one or both of the transmitter voltage and timing thresholds applied by the VRD 110 to the memory 104. In other examples, a system may be heated or cooled and subsequently margin may be measured.

The method of FIG. 3 includes reading 304 the test pattern from memory to generate a read pattern. Continuing the aforementioned example, the UEFI platform 106 may read one or more test pattern results from the memory 104 and determine error based on the read test pattern. The method also includes determining 306 error based on a comparison of the read test pattern to the written test pattern. For example, the UEFI platform 106 may determine error based on a comparison of the read test pattern to the written test pattern.

The method of FIG. 3 includes determining 308 an operating margin of the memory based on the determined error. As an example, the BMC 108 may determine the operating margin based on operating margin statistics obtained by BIOS output. Further, the method of FIG. 3 includes determining 310 whether the operating margin meets a predetermined condition. In response to determining that the operating margin meets the predetermined condition, the method includes lowering 312 a fan speed. In contrast, in response to determining that the operating margin does not meet the predetermined condition, the fan may resume 314 its normal operation. For example, the BMC 108 may control the fan unit 112 to reduce fan speed in response to determining that the operating margin meets the predetermined condition, or control the fan unit 112 to allow normal operation of the fan unit 112 in response to determining that the operating margin does not meet the predetermined condition. Further, for example, the fan speed may be varied based on a level of the margin of error.

It is noted that the example method of FIG. 3 may return to step 302 upon initialization of the system. Alternatively, the system may implement step 302 and subsequent steps periodically or upon suitable instruction by the system.

In accordance with embodiments of the present invention, the system may control a memory regulator output based on operating margin of a memory interface. Initially, for example, the system may determine an operating margin of a memory interface, and determine whether the operating margin of the memory interface meets a predetermined condition similar to or the same as the examples disclosed herein. Subsequently, the system may control a memory regulator output based on the operating margin in response to determining the operating margin meets the predetermined condition. It is noted that memory regulators may have variable outputs, and that they can be used in steps, though, so memory can be configured at 1.5 V, 1.35 V, or 1.2 V, for example. Memory regulator output may be decreased by some amount in proportion or some other relation to the amount of memory margin.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter situation scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   determining an operating margin of a memory interface;
   determining whether the operating margin of the memory interface meets a predetermined condition; and
   in response to determining the operating margin meets the predetermined condition, controlling a speed of a computing system cooling fan based on the operating margin.

2. The method of claim 1, wherein determining an operating margin of the memory interface comprises:
   writing a test pattern over the memory interface into the memory;
   reading the test pattern from the memory to generate a read pattern; and
   determining error based on a comparison of the read test pattern to the written test pattern, and
   wherein controlling a speed of a computing system cooling fan comprises controlling the speed of the computing system cooling fan based on the determined error.

3. The method of claim 2, further comprising varying the test pattern to determine the error.

4. The method of claim 3, wherein varying the test pattern comprises varying one of receiver voltage and timing thresholds.

5. The method of claim 3, wherein varying the test pattern comprises varying one of transmitter voltage and timing levels.

6. The method of claim 1, wherein controlling a speed of a computing system cooling fan comprises using a baseboard management controller to control the speed of the computing system cooling fan.

7. The method of claim 1, wherein determining an operating margin comprises determining the operating margin during system initialization.

8. The method of claim 1, further comprising:
   determining system initialization of a system associated with the memory interface; and
   in response to determining the system initialization, implementing the steps of determining an operating margin of the memory interface and determining whether the operating margin of the memory interface meets a predetermined condition.

9. The method of claim 1, further comprising receiving BIOS output, and
   wherein determining whether the operating margin of the memory interface meets a predetermined condition comprises:
   determining statistics associated with the operating margin based on the BIOS output; and
   determining whether the operating margin meets the predetermined condition based on the statistics.

10. The method of claim 1, wherein determining whether the operating margin of the memory interface meets a predetermined condition comprises determining whether the operating margin is greater than a predetermined level, and wherein controlling a speed of a computing system cooling fan comprises reducing the speed of the computing system cooling fan in response to determining whether the operating margin is greater than the predetermined level.

11. A system comprising:
    a computing device configured to:
    determine an operating margin of a memory interface;
    determine whether the operating margin of the memory interface meets a predetermined condition; and
    control a speed of a computing system cooling fan based on the operating margin in response to determining the operating margin meets the predetermined condition.

12. The system of claim 11, wherein the computing device is configured to:
    write a test pattern over the memory interface into the memory;
    read the test pattern from the memory to generate a read pattern;
    determine error based on a comparison of the read test pattern to the written test pattern; and
    control the speed of the computing system cooling fan based on the determined error.

13. The system of claim 12, wherein the computing device is configured to vary the test pattern to determine the error.

14. The system of claim 13, wherein the computing device is configured to vary one of receiver voltage and timing thresholds.

15. The system of claim 13, wherein the computing device is configured to vary transmitter voltage and timing levels.

16. The system of claim 11, wherein the computing device is configured to use a baseboard management controller to control the speed of the computing system cooling fan.

17. The system of claim 11, wherein the computing device is configured to determine the operating margin during system initialization.

18. The system of claim 11, wherein the computing device is configured to:
    determine system initialization of a system associated with the memory interface; and
    implement the functions of determining an operating margin of the memory interface and determining whether the operating margin of the memory interface meets a predetermined condition in response to determining the system initialization.

19. A method comprising:
    determining an operating margin of a memory interface;
    determining whether the operating margin of the memory interface meets a predetermined condition; and
    in response to determining the operating margin meets the predetermined condition, controlling a memory regulator output based on the operating margin.

20. The method of claim 19, wherein controlling a memory regulator output comprises reducing the memory regulator output based on an amount of the operating margin.

* * * * *